United States Patent
Shiohara et al.

(10) Patent No.: US 10,728,997 B2
(45) Date of Patent: Jul. 28, 2020

(54) PLASMA GENERATOR

(71) Applicant: TDK CORPORATION, Tokyo (JP)

(72) Inventors: Takahiro Shiohara, Tokyo (JP);
Takeshi Kamono, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/465,191

(22) PCT Filed: Nov. 21, 2017

(86) PCT No.: PCT/JP2017/041842
§ 371 (c)(1),
(2) Date: Sep. 23, 2019

(87) PCT Pub. No.: WO2018/101126
PCT Pub. Date: Jun. 7, 2018

(65) Prior Publication Data
US 2020/0053862 A1 Feb. 13, 2020

(30) Foreign Application Priority Data
Dec. 2, 2016 (JP) .................................. 2016-234846

(51) Int. Cl.
| | |
|---|---|
| *H05H 1/24* | (2006.01) |
| *H01L 31/107* | (2006.01) |
| *H02M 7/48* | (2007.01) |
| *H01L 41/107* | (2006.01) |

(52) U.S. Cl.
CPC ......... *H05H 1/2406* (2013.01); *H01L 41/107* (2013.01); *H02M 7/48* (2013.01)

(58) Field of Classification Search
None
See application file for complete search history.

(56) References Cited

U.S. PATENT DOCUMENTS

| 2009/0135538 | A1 | 5/2009 | Yasuoka et al. | |
|---|---|---|---|---|
| 2016/0126754 | A1* | 5/2016 | Ichikawa | H02J 7/025 |
| | | | | 307/104 |

FOREIGN PATENT DOCUMENTS

| JP | H04-256280 A | 9/1992 |
|---|---|---|
| JP | 2001-078442 A | 3/2001 |
| JP | 2002-237394 A | 8/2002 |
| JP | 2009-129673 A | 6/2009 |
| JP | 2010-277730 A | 12/2010 |

OTHER PUBLICATIONS

Feb. 6, 2018 Search Report issued in International Patent Application No. PCT/JP2017/041842.

* cited by examiner

*Primary Examiner* — Jany Richardson
(74) *Attorney, Agent, or Firm* — Oliff PLC

(57) ABSTRACT

A plasma generator capable of adjusting the amount of plasma generation in a simple configuration includes a control circuit controlling a frequency of an AC power supplied to a piezoelectric transformer and a control signal generation circuit providing a control signal to the control circuit. The plasma generator is configured so that the control signal output from the control signal generation circuit is appropriately adjusted. The control circuit controls the frequency of the AC power so as to bring a target value, which is set based on the control signal provided from the control signal generation circuit.

2 Claims, 3 Drawing Sheets

PLASMA GENERATOR

TECHNICAL FIELD

The present invention relates to a plasma generator using a piezoelectric transformer.

BACKGROUND ART

In recent years, there has been growing interest in low temperature plasma technology in a wide range of fields. For example, this low temperature plasma has been used to modify the surface properties of a material. Low temperature plasma can also be used to clean and sterilize the surface and air of a substance, and is expected to be used in the medical and food fields.

The low temperature plasma can be generated by causing a dielectric barrier discharge. A piezoelectric transformer is widely used to cause this dielectric barrier discharge. Patent Document 1 discloses a technology in which an AC voltage is applied to the input side of the piezoelectric transformer, and a high voltage is generated on the output side, and a dielectric barrier discharge is generated by the high voltage. Furthermore, in this document, gas molecules in the air are ionized by the plasma generated by the dielectric barrier discharge to generate an ion for ionization.

In addition, the development of compact, lightweight, portable products is required for such plasma generators and ion generators. Also, since the low temperature plasma can be utilized for various applications, it is preferable that the amount of plasma generation can be adjusted according to the application.

PRIOR ART LITERATURE

Patent Document

Patent Document 1: Japanese Patent Application Publication No. 2009-129673

SUMMARY

Problems to be Solved by the Invention

As a result of the above-mentioned requirements, a piezoelectric transformer suitable for compact, lightweight and portable products is being developed. However, the plasma generator using the piezoelectric transformer has not been adequately studied. In addition, a plasma generator that can adjust the generation of plasma depending on the application has not yet been adequately studied to take advantage of the potential of the plasma generator.

Accordingly, the present invention is intended to provide a plasma generator capable of adjusting the amount of plasma generation in a simple configuration in order to satisfy the above-described requirement.

Means for Solving the Problems

A plasma generator related to the present invention includes: an electrical power source configured to output a DC power; a detection circuit configured to detect a voltage and a current output from the electrical power source; a drive circuit configured to convert the DC power into an AC power; a control circuit configured to control a frequency of the AC power output from the drive circuit; a control signal generation circuit configured to generate a control signal to be input to the control circuit; and a piezoelectric transformer configured for the AC power to be supplied to, wherein the control circuit is configured to calculate an electrical power supplied from the electrical power source based on the voltage and current detected by the detection circuit, and to control the frequency of the AC power so that the electrical power approaches a target electrical power determined based on the control signal.

Another plasma generator related to the present invention includes: an electrical power source configured to output a DC power; a drive circuit configured to convert the DC power into an AC power; a control circuit configured to control a frequency of the AC power output from the drive circuit; a control signal generation circuit configured to generate a control signal to be input to the control circuit; and a piezoelectric transformer configured for the AC power to be supplied to, wherein the control circuit is configured to detect a phase difference between a voltage and a current of the AC power supplied to the piezoelectric transformer, and to control the frequency of the AC power so that the phase difference approaches a target phase difference determined based on the control signal.

In the above-described plasma generators, the target value of the electrical power supplied from the electrical power source or the target value of the phase difference between the voltage and the current of the AC power supplied to the piezoelectric transformer is determined based on the control signal output from the control signal generating circuit. Since the amount of plasma generation varies with these target values, the amount of plasma generation can be controlled by the control signal output from the control signal generation circuit.

In the above-described plasma generators, the control signal generation circuit may includes: a series regulator configured to output a predetermined constant voltage from a DC voltage supplied from the electrical power source; and first and second resistors connected in parallel to the series regulator, the first and second resistors being configured to generate the control signal by dividing the constant voltage, and one of the first and second resistors is configured so that a resistance value is capable of being varied. According to this, the resistance value of the resistance can be adjusted to vary the control signal input to the control circuit. Accordingly, it is possible to easily adjust the amount of plasma generation by the plasma generator by the user.

Effect of the Invention

According to the plasma generator of the present invention, a simple configuration can be used to adjust the amount of plasma generation. Also, a small, inexpensive plasma generator can be provided.

EMBODIMENTS

Figure 1:
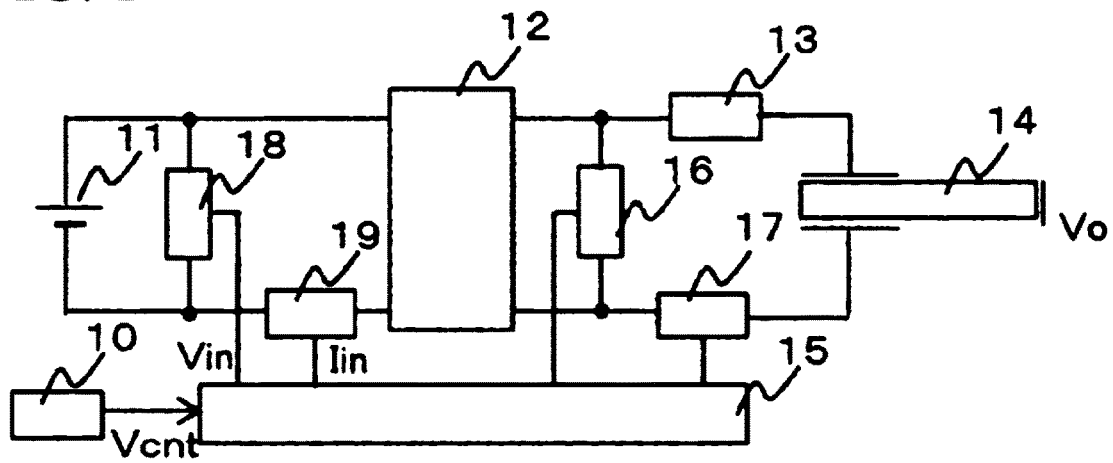
FIG. 1 is a block diagram illustrating a circuit configuration of a plasma generator according to an embodiment of the present invention.

Embodiments for carrying out the invention are described with reference to the drawings. The present invention is not limited by the contents described in the following embodiments. In the following description, the same reference numerals shall be used for the same element or an element having the same function, and the duplicate explanation shall be omitted.

FIG. 1 is a block diagram illustrating a circuit configuration of a plasma generator according to an embodiment of the present invention. Here, the power source 11 is a power source that outputs DC power, and a battery or the like can be used. The drive circuit 12 is a circuit that converts DC power supplied from the power source 11 into AC power. The sinusoidal filter 13 is a circuit that shapes the waveform of the AC voltage supplied from the drive circuit 12 into a sine wave. The piezoelectric transformer 14 is a device that converts AC power into mechanical vibration and further converts the mechanical vibration into AC power for power transmission. The control circuit 15 is a circuit that controls the frequency of AC power output from the drive circuit 12. The voltage detection circuit 16 is a circuit that detects the phase of the voltage output from the drive circuit 12. The current detection circuit 17 is a circuit that detects the phase of the current output from the drive circuit 12. The phase difference between the voltage and current, which is the difference between the phase of the voltage detected by the voltage detection circuit 16 and the phase of the current detected by the current detection circuit 17, is detected by the control circuit 15. The power supply voltage detection circuit 18 is a circuit that detects the voltage value Vin of the voltage output from the power source 11. The current mean value detection circuit 19 is a circuit that detects the current mean value Iin of the current output from the power source 11. The control signal generating circuit 10 is a circuit that generates a control signal to the control circuit 15.

Figure 2A:
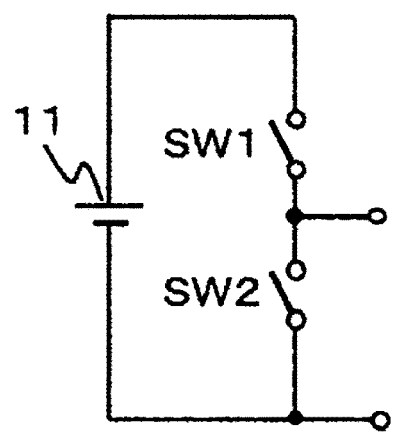
FIG. 2a is a diagram illustrating an example of a drive circuit.
Figure 2B:
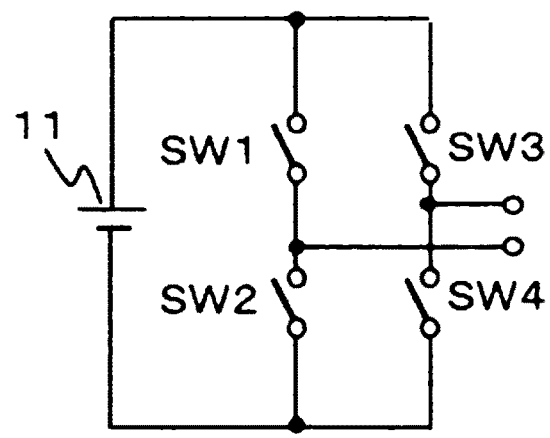
FIG. 2b is a diagram illustrating an example of a drive circuit.

The drive circuit 12 may, for example, use a circuit consisting of two switching elements (FIG. 2a) or a full bridge circuit consisting of four switching elements (FIG. 2b). In the circuit of FIG. 2a, when the switching element SW1 is turned on, the switching element SW2 is turned off, and when the switching element SW1 is turned off, the switching element SW2 is turned on. In the circuit of FIG. 2b, when the switching element SW1 and the switching element SW4 are turned on simultaneously, the switching element SW2 and the switching element SW3 are turned off simultaneously. When the switching element SW1 and the switching element SW4 are turned off simultaneously, the switching element SW2 and the switching element SW3 are turned on simultaneously. The on-off of such switching elements provides AC power to the piezoelectric transformer 14.

Figure 3:
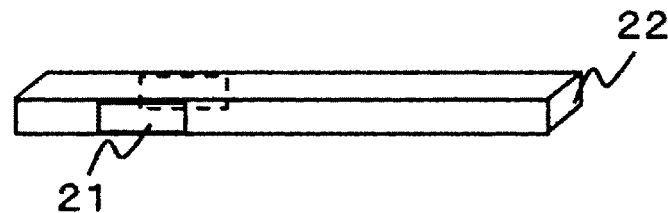
FIG. 3 is a diagram illustrating a piezoelectric transformer.

The piezoelectric transformer is, for example, a rectangular element made of a piezoelectric ceramic material as illustrated in FIG. 3, and an internal electrode of the laminated structure is formed at a portion of the primary side electrode portion 21. As a piezoelectric ceramic material, a piezoelectric ceramic material based on lead zirconate titanate or the like can be used. This piezoelectric transformer is a laminated Rosen-type piezoelectric transformer, and by applying an AC voltage to the primary side electrode portion 21, an elastic standing wave is generated in the rectangular element. As a result, a high voltage is generated at the secondary end 22, resulting in a discharge phenomenon called dielectric barrier discharge. As long as ionization (gas ionization) continues, plasma generation is maintained by this discharge phenomenon. In the piezoelectric transformer of the type in which the secondary side end 22 does not have a discharge electrode, the charge collects on the surface of the secondary side end 22, a strong electric field is formed, and a discharge phenomenon is generated by this electric field.

Figure 4:
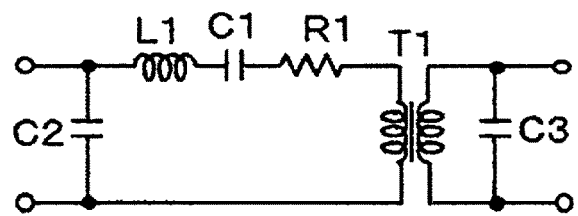
FIG. 4 is a circuit diagram illustrating an equivalent circuit of a piezoelectric transformer.

The piezoelectric transformer has electrical properties based on the equivalent circuit shown in FIG. 4. In this equivalent circuit, the inductor L1, the capacitor C2, and the resistor R1 are connected in series with respect to the transformer T1 to the primary side of the transformer T1, and the capacitor C2 is connected in parallel with respect to the transformer T1. The capacitor C3 is connected to the secondary side of the transformer T1 in parallel with respect to the transformer T1. The piezoelectric transformer generates a high voltage on the secondary side as the resonant frequency is determined by these circuit elements and the AC voltage of the resonant frequency is applied to the primary side.

The plasma generator according to the embodiments of the present invention is configured such that the amount of plasma generation is adjusted based on the control signal provided by the control circuit 15 from the control signal generating circuit 10. Accordingly, the amount of plasma generation can be adjusted by changing the control signal output from the control signal generating circuit 10.

Example 1

Figure 5:
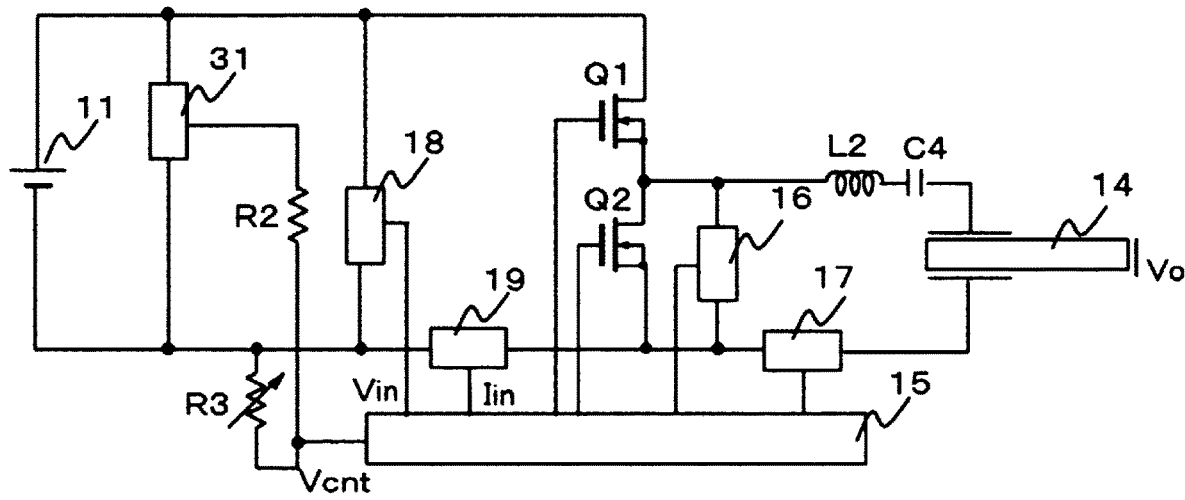
FIG. 5 is a circuit diagram illustrating the first embodiment.

FIG. 5 is a circuit diagram of a plasma generator according to the first embodiment. In this plasma generator, the drive circuit consists of two transistors Q1 and Q2. The sinusoidal filter includes the inductor L2 and the capacitor C4. The resonant frequency of the resonant circuit composed of the inductor L2 and the capacitor C4 is set in accordance with the switching frequency of the transistors Q1 and Q2, i.e., the frequency of AC power supplied from the drive circuit (hereinafter referred to as the driving frequency). Although the resonant frequency of this resonant circuit is affected by the electrical characteristics of the piezoelectric transformer (e.g., capacitor C2), its effect can be ignored if the capacitance of capacitor C4 is sufficiently greater than that of capacitor C2 contained in the piezoelectric transformer. The drive frequency is also controlled to vary within a predetermined range, and the resonant frequency of the resonant circuit is preferably set at a frequency within that range.

The control signal generation circuit includes the series regulator 31 and resistors R2 and R3. The series regulator 31 generates a predetermined constant voltage from the DC voltage supplied from the power source 11. The constant voltage output from the series regulator 31 is divided by the resistors R2 and R3, and the divided voltage is input to the control circuit 15. The divided voltage input to the control circuit 15 can be varied by varying the resistance value of the resistor R2 or resistor R3. In the plasma generator of the present embodiment, the plasma generator is configured so that the user of the plasma generator can vary the resistance value of the resistor R3. Accordingly, by the user adjusting the resistance value of the resistor R3, the voltage value of the divided voltage input to the control circuit 15 can be set to a predetermined voltage value. This divided voltage corresponds to a control signal Vcnt that is input to the control circuit 15.

The control circuit 15 determines the target power Vt or the target phase difference θ based on the voltage value of the control signal Vcnt. That is, based on the voltage value of the control signal Vcnt, the target power Wt or the target phase difference θ is set and the switching operation of the drive circuit 12 is controlled to approach the set value. If the target power Vt is set, the control circuit 15 calculates the power supplied from the power source 11 based on the voltage value Vin detected by the power supply voltage detection circuit 18 and the current mean value Iin detected by the current mean value detection circuit 19, and controls the drive frequency so that the power value approaches the target power Wt. If the target phase difference θt is set, the control circuit 15 controls the drive frequency so that the phase difference of the voltage and current, which is the phase difference of the voltage detected by the voltage detection circuit 16 and the phase of the current detected by the current detection circuit 17, approaches the target phase difference θt.

Figure 6:
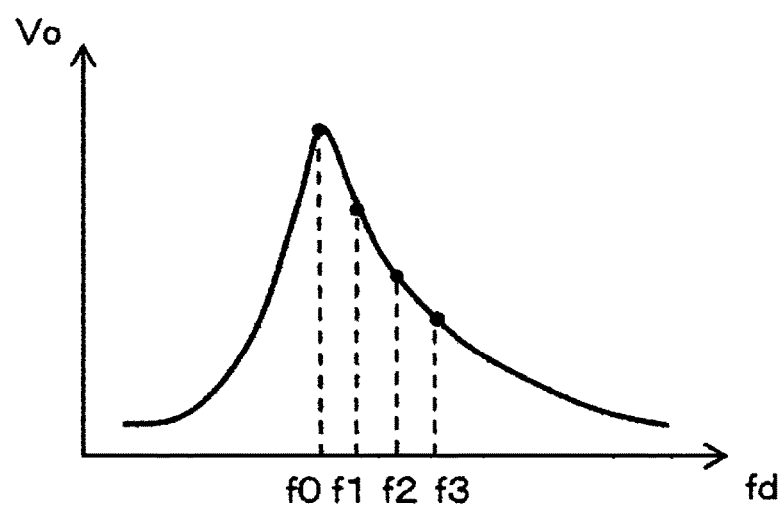
FIG. 6 is a graph showing the relationship between the drive frequency and the output voltage of the piezoelectric transformer.

FIG. 6 is a graph showing the relationship between the drive frequency fd and the output voltage Vo of the piezoelectric transformer 14. In this graph, f0 corresponds to the resonant frequency, and the output voltage Vo of the piezoelectric transformer 14 is maximized when the drive frequency fd matches this resonant frequency. Here, when the driving frequency fd is brought closer to the resonant frequency f0, the output voltage Vo of the piezoelectric transformer 14 increases as the driving frequency fd approaches the resonant frequency f0. Also, the phase difference θ between the voltage and current of the AC power supplied to the piezoelectric transformer decreases as the drive frequency fd approaches the resonant frequency f0. For example, if the drive frequency fd is switched at three frequencies f3, f2, and f1(f3>f2>f1) higher than the resonant frequency f0, the output voltage Vo of the transformer 14 becomes the lowest when the drive frequency fd is f3, and the phase difference θ between the voltage and current of the AC power supplied to the piezoelectric transformer becomes the largest. When the driving frequency fd is changed from f3 to f2, the output voltage Vo of the piezoelectric transformer 14 increases, and the phase difference θ of the voltage and current of the AC power supplied to the piezoelectric transformer decreases. Further, changing the drive frequency fd from f2 to f1 further increases the output voltage Vo of the piezoelectric transformer 14 and further reduces the phase difference θ of the voltage and current of the AC power supplied to the piezoelectric transformer. When the driving frequency fd is f1, the output voltage Vo of the piezoelectric transformer 14 is highest, and the phase difference θ of the voltage and current of the AC power supplied to the piezoelectric transformer is lowest.

In the plasma generator illustrated in FIG. 5, if the power value calculated based on the voltage value Vin detected by the power supply voltage detection circuit 18 and the current mean value Iin detected by the current mean value detection circuit 19 is less than the target power Wt, the drive frequency fd is controlled so that the drive frequency fd approaches the resonant frequency f0. Conversely, if the calculated power value is greater than the target power Wt, the drive frequency fd is controlled so that the drive frequency fd is away from the resonant frequency f0. Also, if the phase difference of the voltage and the current, which is the difference between the phase of the voltage detected by the voltage detection circuit 16 and the phase of the current detected by the current detection circuit 17, is greater than the target phase difference θt, the drive frequency fd is controlled so that the drive frequency fd approaches the resonant frequency f0. Conversely, if the phase difference between the voltage and current is less than the target phase difference θt, the drive frequency is controlled so that the drive frequency fd is away from the resonant frequency f0.

In the plasma generator of this embodiment, the user can adjust the resistance value of the resistor R3 to vary the control signal Vcnt input to the control circuit 15. The amount of plasma generation by the plasma generator then varies based on the control signal Vcnt. Such an arrangement allows the user to appropriately adjust the amount of plasma generation by the plasma generator.

Example 2

Figure 7:
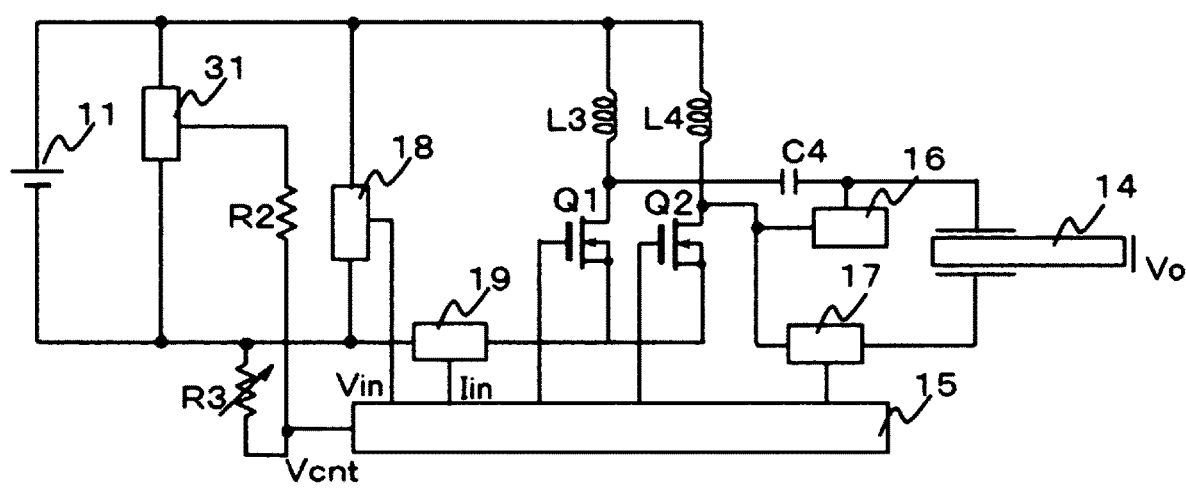
FIG. 7 is a circuit diagram illustrating the second embodiment.

FIG. 7 is a circuit diagram of a plasma generator according to the second embodiment. This circuit is configured to provide AC power to the piezoelectric transformer 14 from the connection between transistor Q1 and inductor L3 and the connection between the transistor Q2 and the inductor L4. The sinusoidal filter includes the inductors L3, L4 and the capacitor C4. The phase difference between the voltage and current is detected at the primary input terminal of the piezoelectric transformer 14.

The operation of the plasma generator and the control circuit 15 according to the second embodiment are the same as the plasma generator according to the first embodiment, but the circuitry for turning on and off the transistors Q1 and Q2 can be relatively simple because the transistors Q1 and Q2 are connected to the low side and there is no high side transistor.

Although the plasma generator embodiments of the present invention have been described above, the present invention is not limited to the embodiments described above, and various modifications may be made without departing from the scope thereof. Also, the plasma generator according to the present invention is not limited to products that utilize only the plasma generated by the dielectric barrier discharge, but does not exclude products that utilize ions or ozone generated by the dielectric barrier discharge.

INDUSTRIAL APPLICABILITY

The plasma generator according to the present invention can be used for applications such as surface treatment, cleaning, sterilization and deodorization in industrial and medical fields.

EXPLANATION OF REFERENCES

10: Control signal generation circuit
11: Power source
12: Drive circuit
13: Sinusoidal filter
14: Piezoelectric transformer
15: Control circuit
16: Voltage detection circuit
17: Current detection circuit
18: Power supply voltage detection circuit
19: Current mean value detection circuit

The invention claimed is:

1. A plasma generator comprising:
an electrical power source configured to output a DC power;
a detection circuit configured to detect a voltage and a current output from the electrical power source;
a drive circuit configured to convert the DC power into an AC power;
a control circuit configured to control a frequency of the AC power output from the drive circuit;
a control signal generation circuit configured to generate a control signal to be input to the control circuit; and
a piezoelectric transformer configured for the AC power to be supplied to, wherein:
the control circuit is configured to calculate an electrical power supplied from the electrical power source based on the voltage and current detected by the detection circuit, and to control the frequency of the AC power so that the electrical power approaches a target electrical power determined based on the control signal,
the control signal generation circuit comprises a series regulator configured to output a predetermined constant voltage from a DC voltage supplied from the electrical power source, and first and second resistors connected in parallel to the series regulator, the first and second resistors being configured to generate the control signal by dividing the constant voltage, and
one of the first and second resistors is configured so that a resistance value is capable of being varied.

2. A plasma generator comprising:
an electrical power source configured to output a DC power;
a drive circuit configured to convert the DC power into an AC power;
a control circuit configured to control a frequency of the AC power output from the drive circuit;
a control signal generation circuit configured to generate a control signal to be input to the control circuit; and
a piezoelectric transformer configured for the AC power to be supplied to, wherein:
the control circuit is configured to detect a phase difference between a voltage and a current of the AC power supplied to the piezoelectric transformer, and to control the frequency of the AC power so that the phase difference approaches a target phase difference determined based on the control signal,
the control signal generation circuit comprises a series regulator configured to output a predetermined constant voltage from a DC voltage supplied from the electrical power source, and first and second resistors connected in parallel to the series regulator, the first and second resistors being configured to generate the control signal by dividing the constant voltage, and
one of the first and second resistors is configured so that a resistance value is capable of being varied.

* * * * *